(12) United States Patent
Casey et al.

(10) Patent No.: US 7,313,775 B2
(45) Date of Patent: Dec. 25, 2007

(54) INTEGRATED CIRCUIT WITH RELOCATABLE PROCESSOR HARDMAC

(75) Inventors: Michael J. Casey, East Twickenham (GB); Danny C. Vogel, Sudbury, MA (US); Thomas W. McKernan, Fort Collin, CO (US)

(73) Assignee: LSI Corporation, Milpitas, CA (US)

( * ) Notice: Subject to any disclaimer, the term of this patent is extended or adjusted under 35 U.S.C. 154(b) by 428 days.

(21) Appl. No.: 11/099,772

(22) Filed: Apr. 6, 2005

(65) Prior Publication Data
US 2006/0230375 A1 Oct. 12, 2006

(51) Int. Cl.
*G06F 17/50* (2006.01)
(52) U.S. Cl. .......................................... 716/10; 716/17
(58) Field of Classification Search ...................... None
See application file for complete search history.

(56) References Cited

U.S. PATENT DOCUMENTS

| | | | | |
|---|---|---|---|---|
| 6,593,772 | B2 * | 7/2003 | Ngai et al. ...................... | 326/40 |
| 6,804,811 | B2 | 10/2004 | Andreev et al. ............... | 716/12 |
| 7,036,102 | B2 * | 4/2006 | Andreev et al. ............... | 716/7 |
| 7,111,264 | B2 * | 9/2006 | Andreev et al. ............... | 716/9 |
| 7,168,052 | B2 * | 1/2007 | Andreev et al. ............... | 716/2 |
| 7,219,321 | B2 * | 5/2007 | Nikitin et al. .................. | 716/8 |
| 2005/0108495 | A1 * | 5/2005 | McKenney et al. .......... | 711/170 |

OTHER PUBLICATIONS

U.S. Appl. No. 10/713,492, filed Nov. 14, 2003, Flexible Design for Memory of Integrated Circuits (38 pages).

U.S. Appl. No. 10/875,128, filed Jun. 23, 2004, Yield Driven Memory Placement System (33 pages).

U.S. Appl. No. 10/688,460, filed Oct. 17, 2003, Process and Apparatus for Fast Assignment of Objects to a Rectangle (22 pages).

U.S. Appl. No. 10/694,208, filed Oct. 27, 2003, Process and Apparatus for Placement of Cells in an IC During Floorplan Creation (26 pages).

U.S. Appl. No. 10/830,739, filed Apr. 23, 2004, Process and Apparatus for Memory Mapping (26 pages).

U.S. Appl. No. 10/713,492, filed Nov. 14, 2003, Flexible Design for Memory Use in Integrated Circuits (51 pages).

* cited by examiner

*Primary Examiner*—Leigh M. Garbowski
(74) *Attorney, Agent, or Firm*—Westman, Champlin & Kelly, P.A.

(57) ABSTRACT

An integrated circuit layout is provided, which includes a base platform for an integrated circuit, a processor hardmac and a support memory. The base platform includes a memory matrix having leaf cells arranged in rows and columns. Each column of leaf cells has interface pins that are routed to a common matrix edge and have a common pin order along the matrix edge. The processor hardmac is placed along the memory matrix and has a hardmac edge adjacent the memory matrix edge and a plurality of interface pins for interfacing with corresponding interface pins of the memory matrix. The interface pins of the processor hardmac have the same pin order along the hardmac edge as the interface pins along the matrix edge. The support memory for the processor hardmac is mapped to a portion of the memory matrix along the hardmac edge.

27 Claims, 12 Drawing Sheets

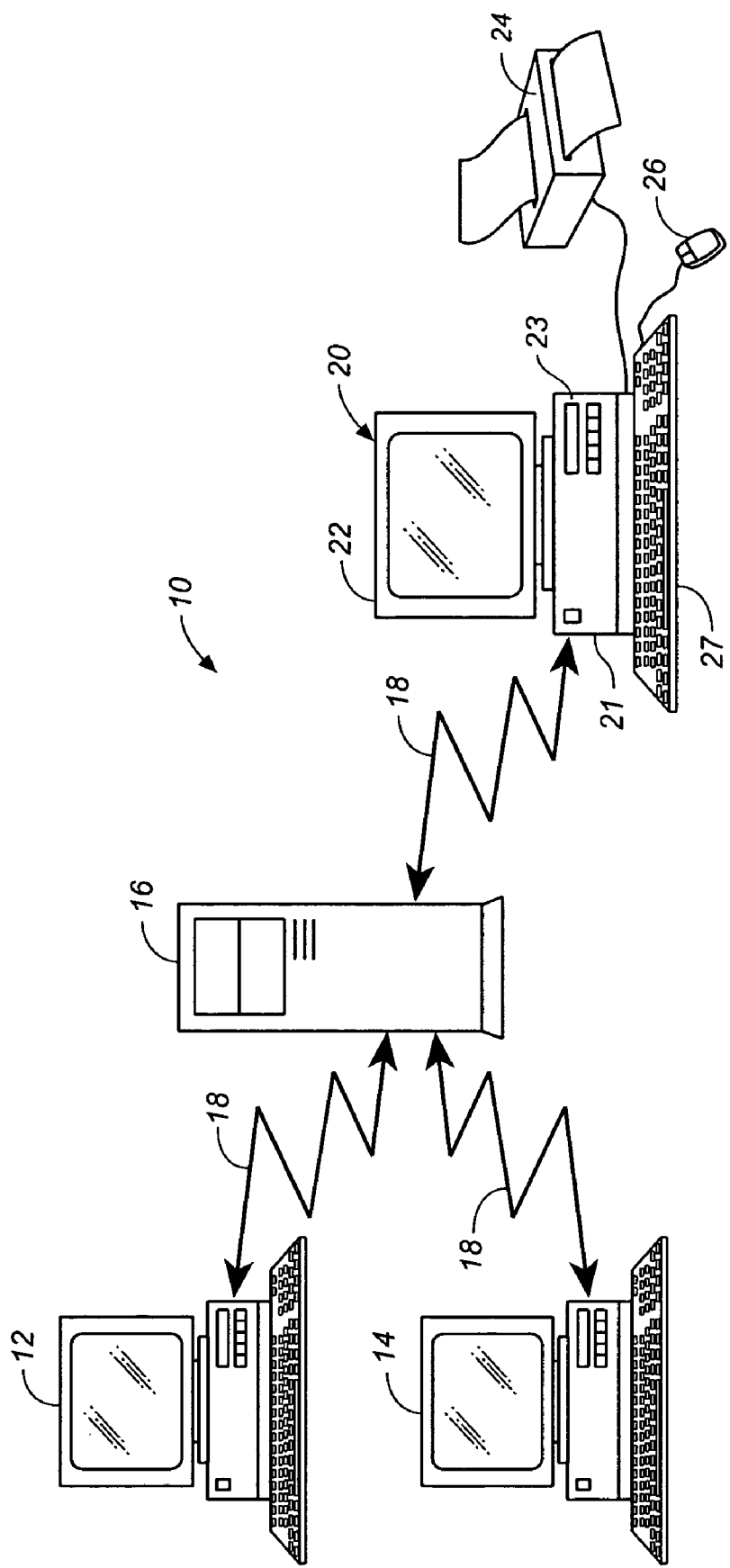
FIG._1

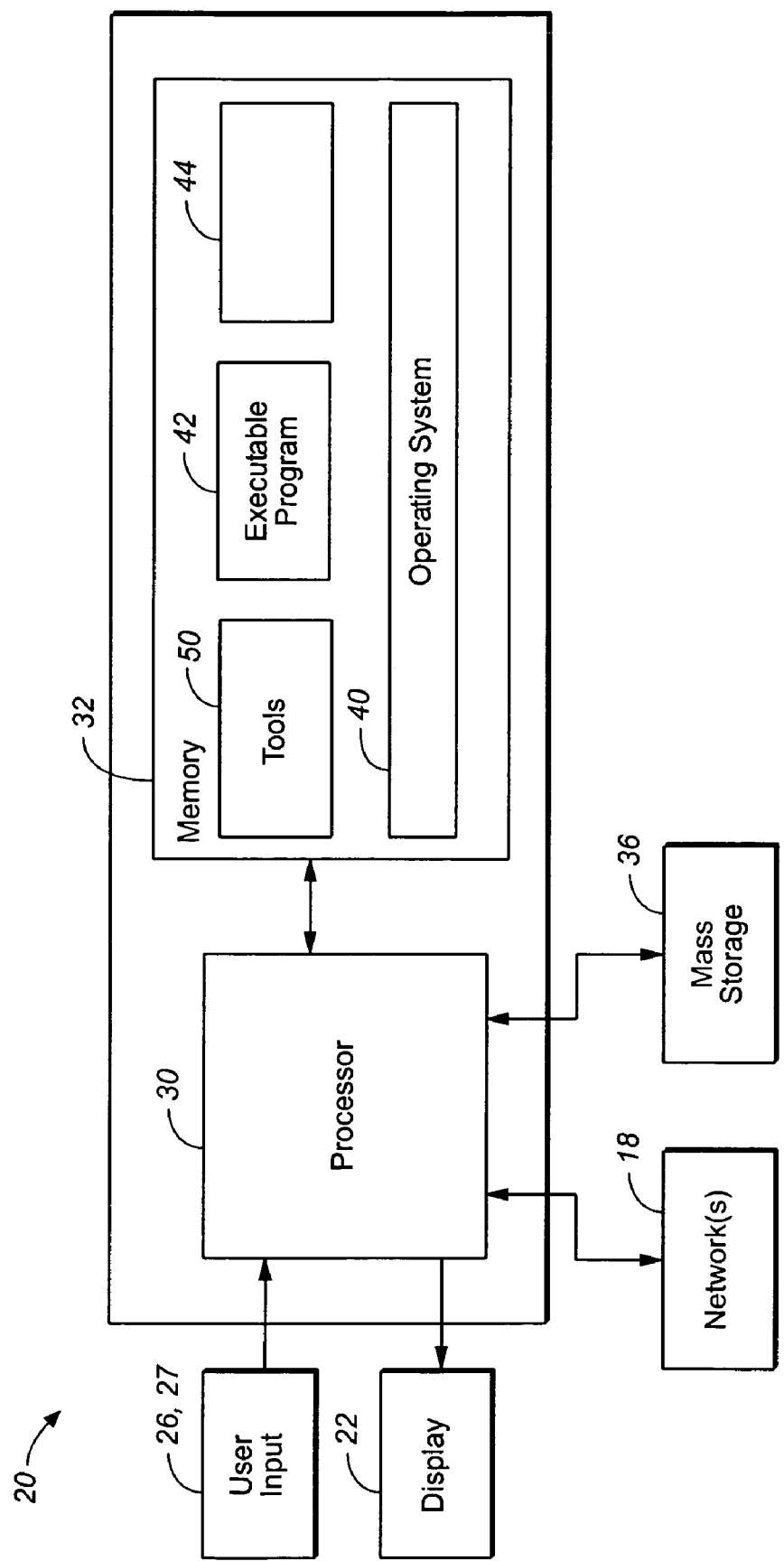
FIG._2

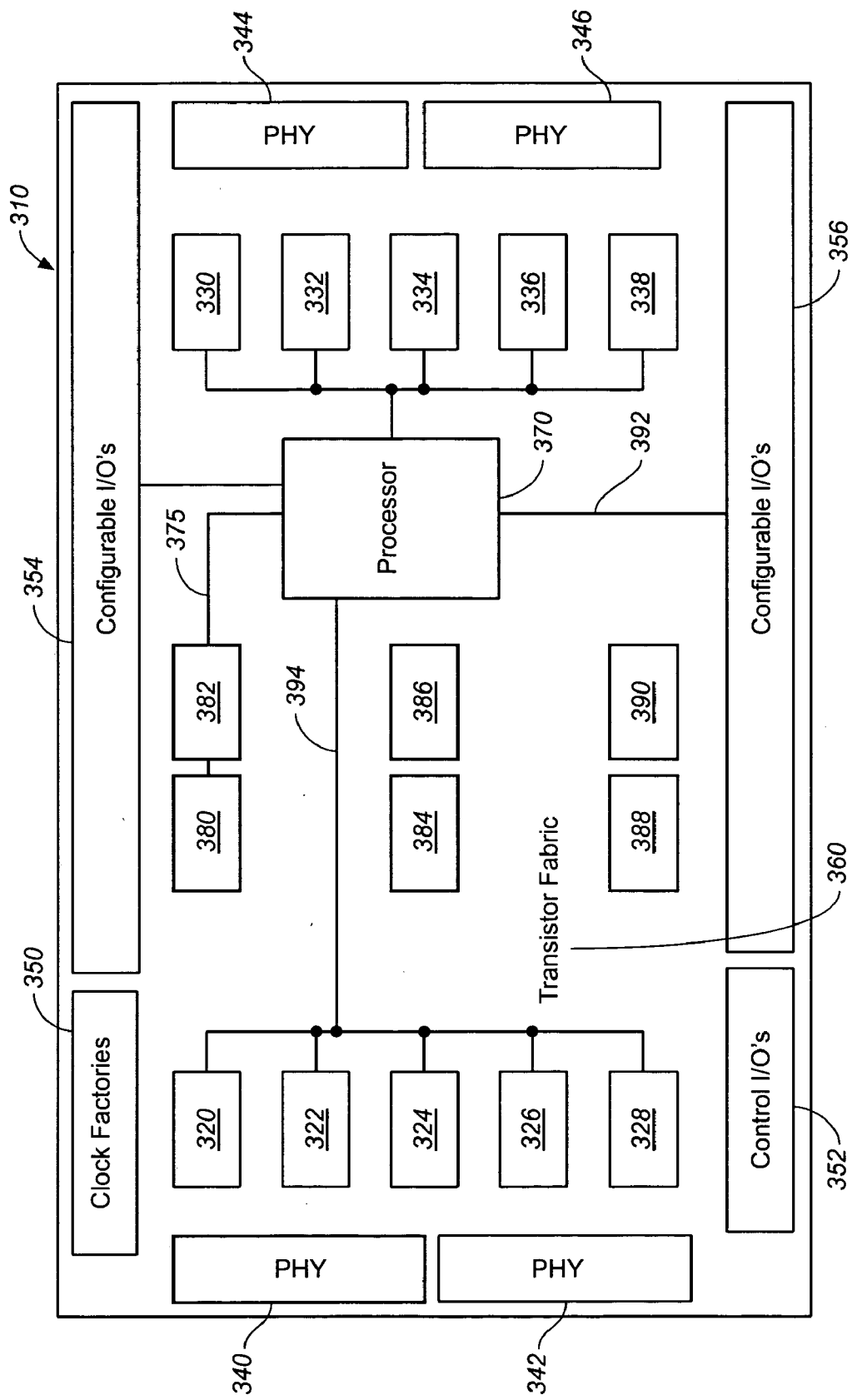
FIG._3

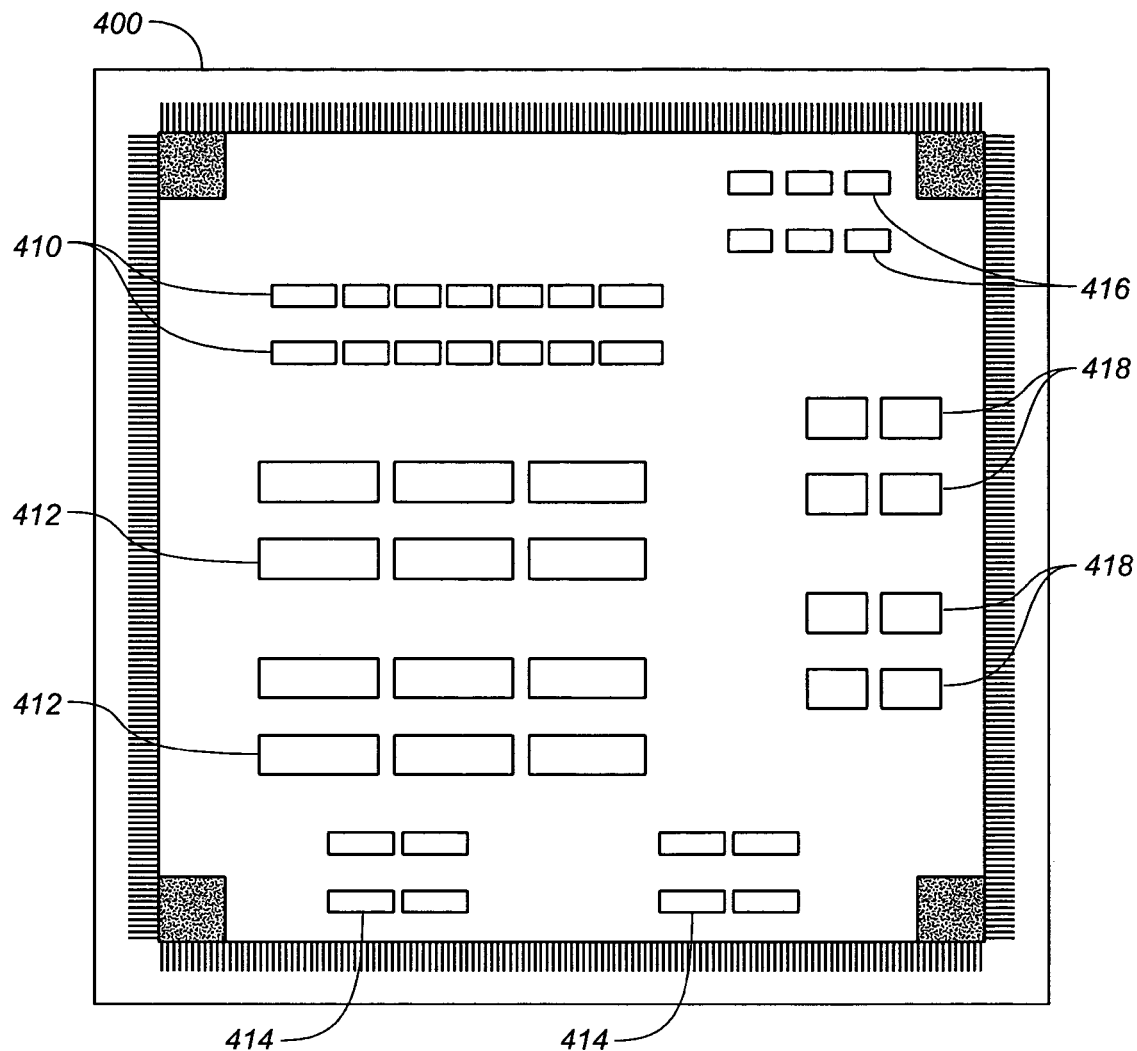
FIG._4
*(PRIOR ART)*

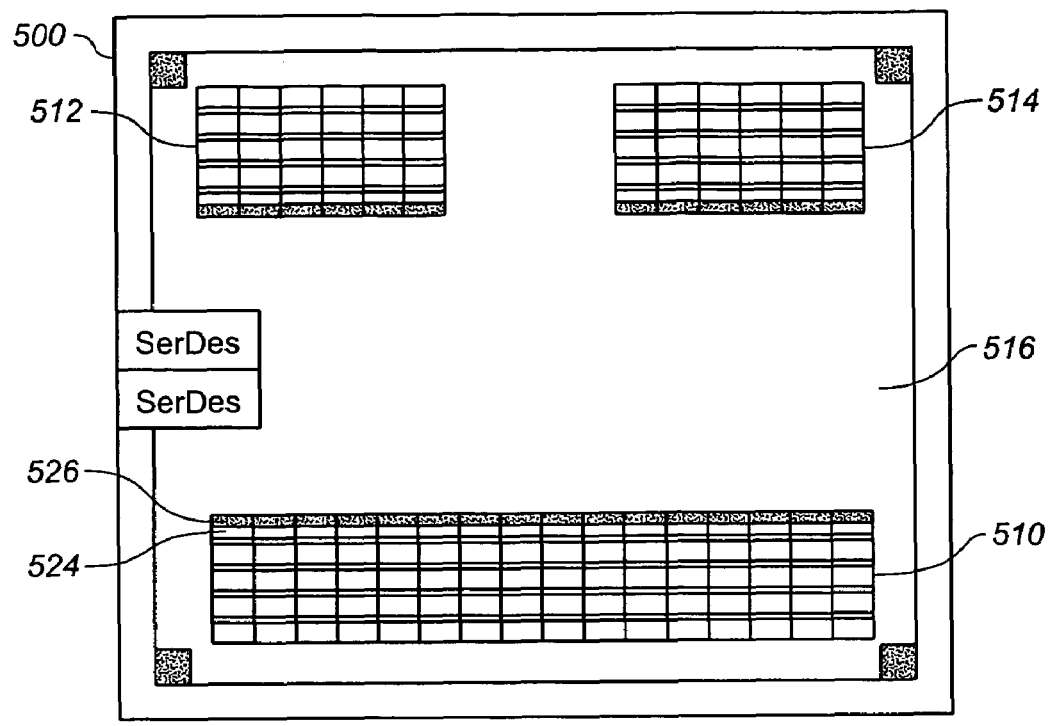
FIG._5
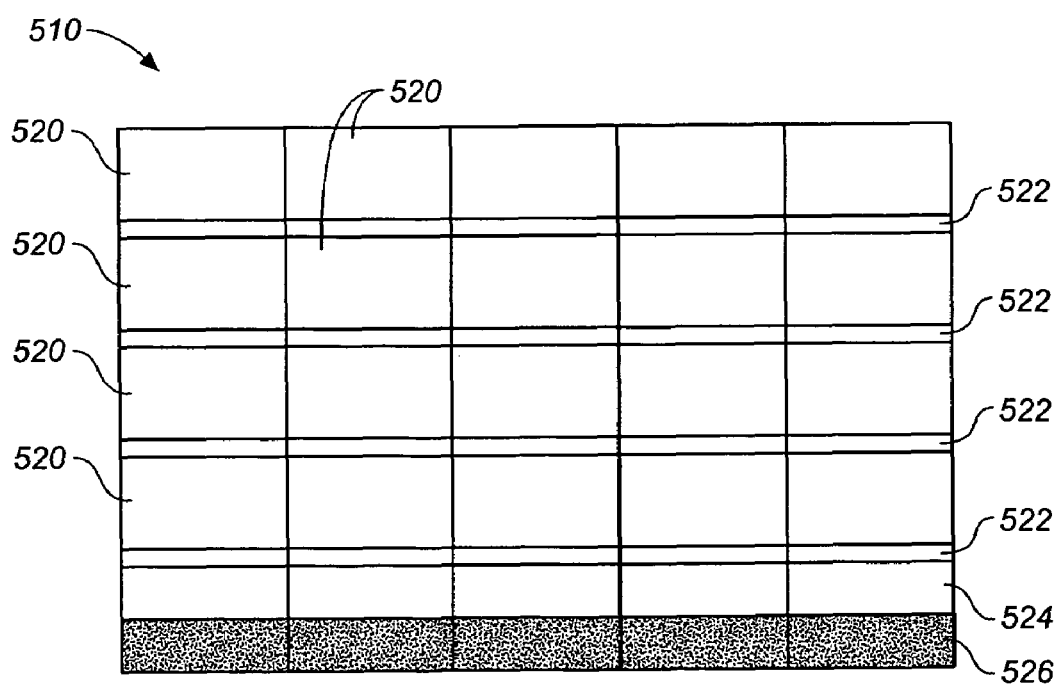
FIG._6

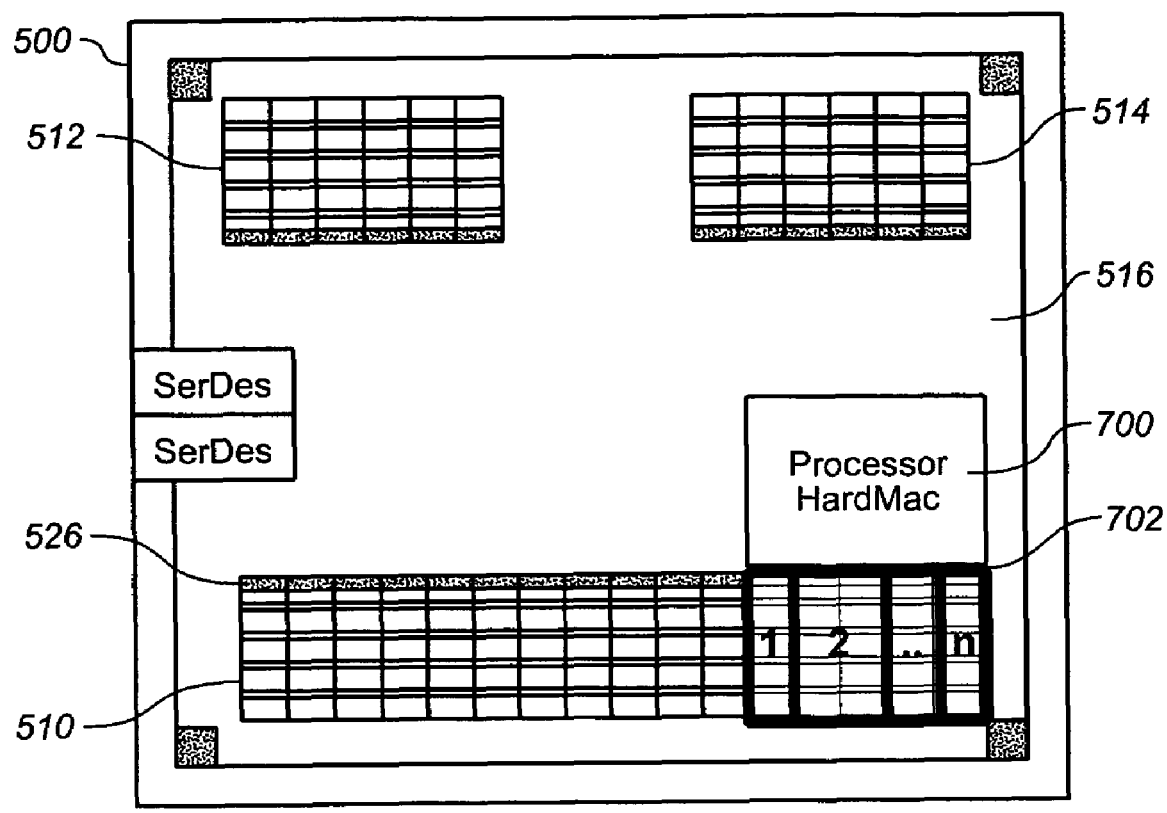
FIG._7

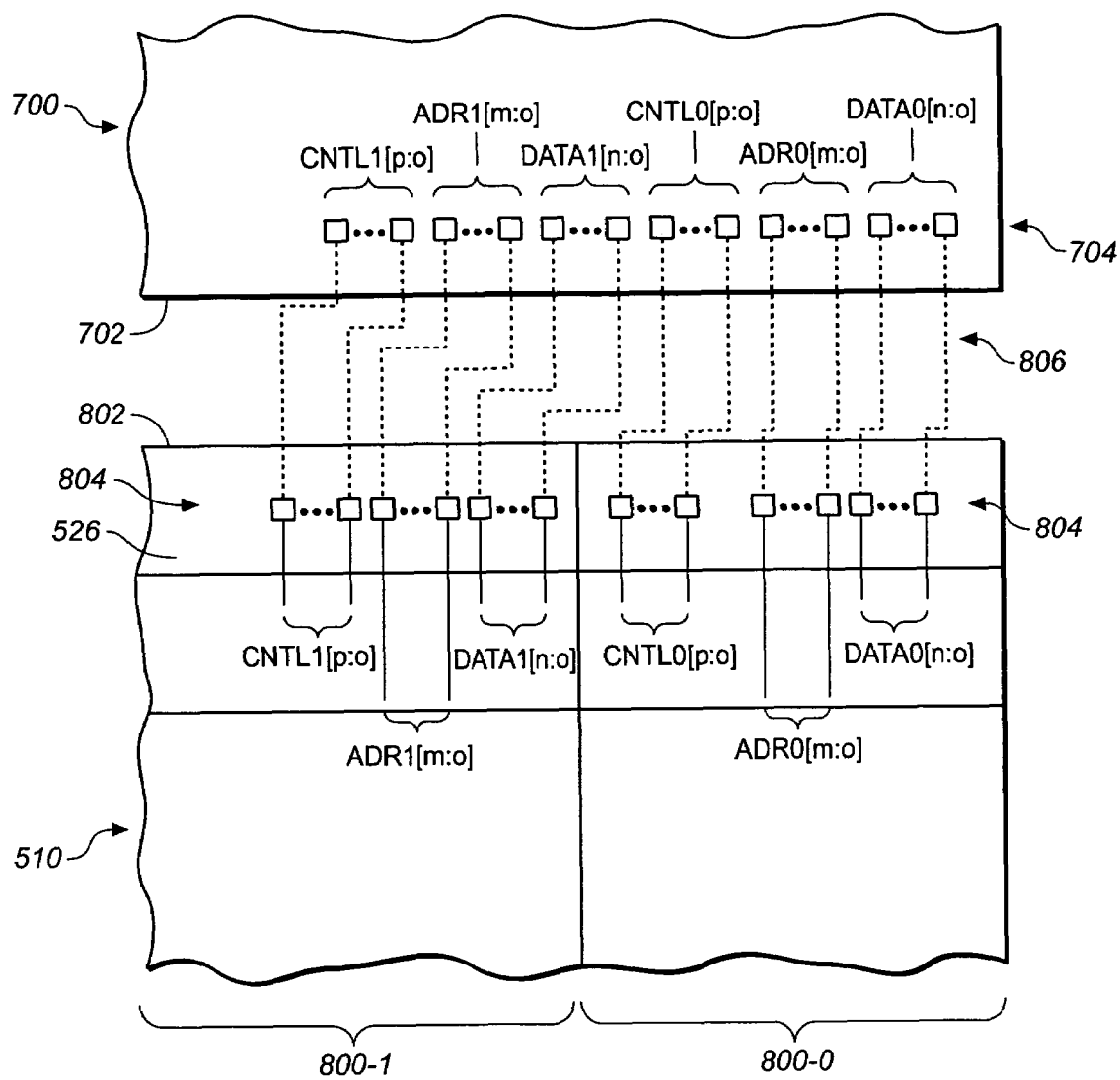
FIG._8

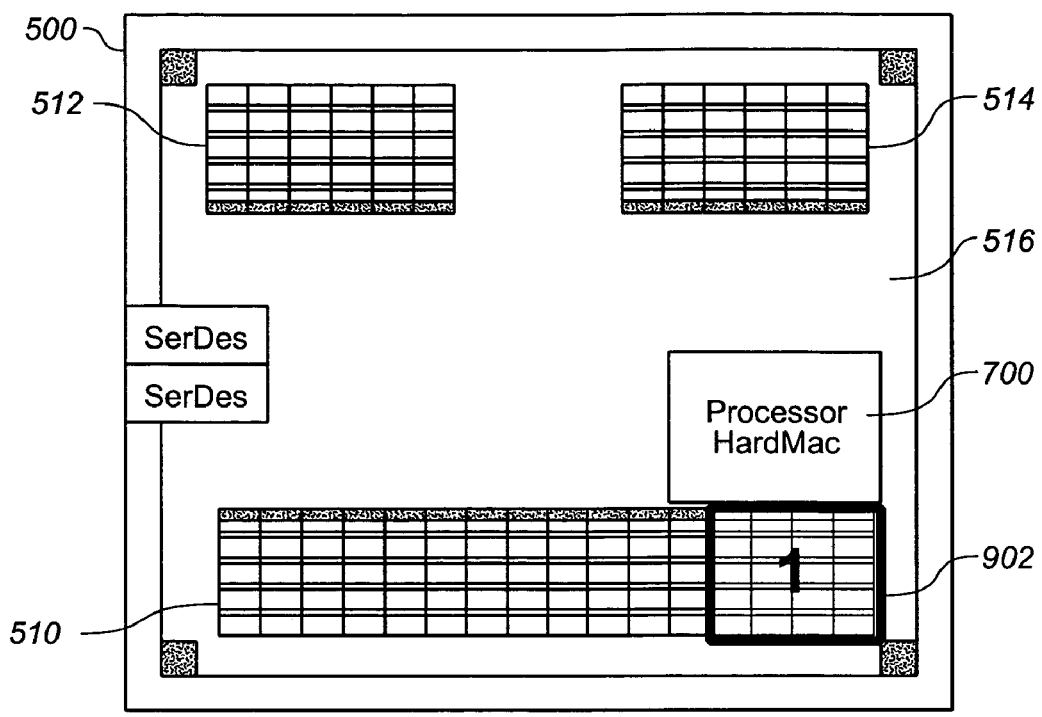
FIG._9
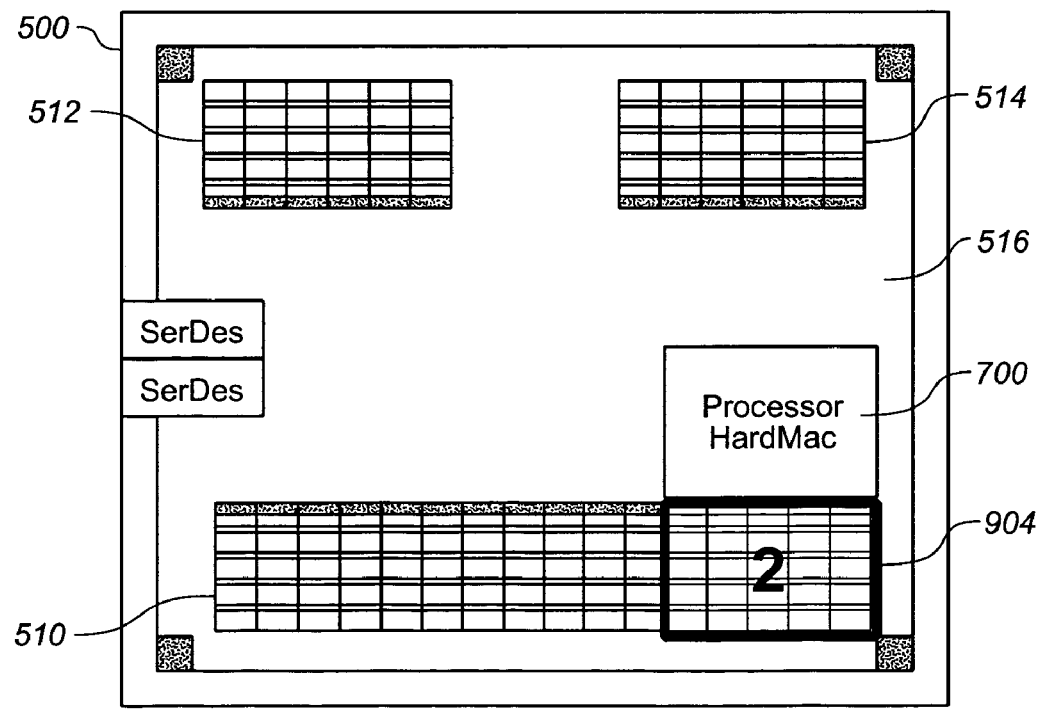
FIG._10

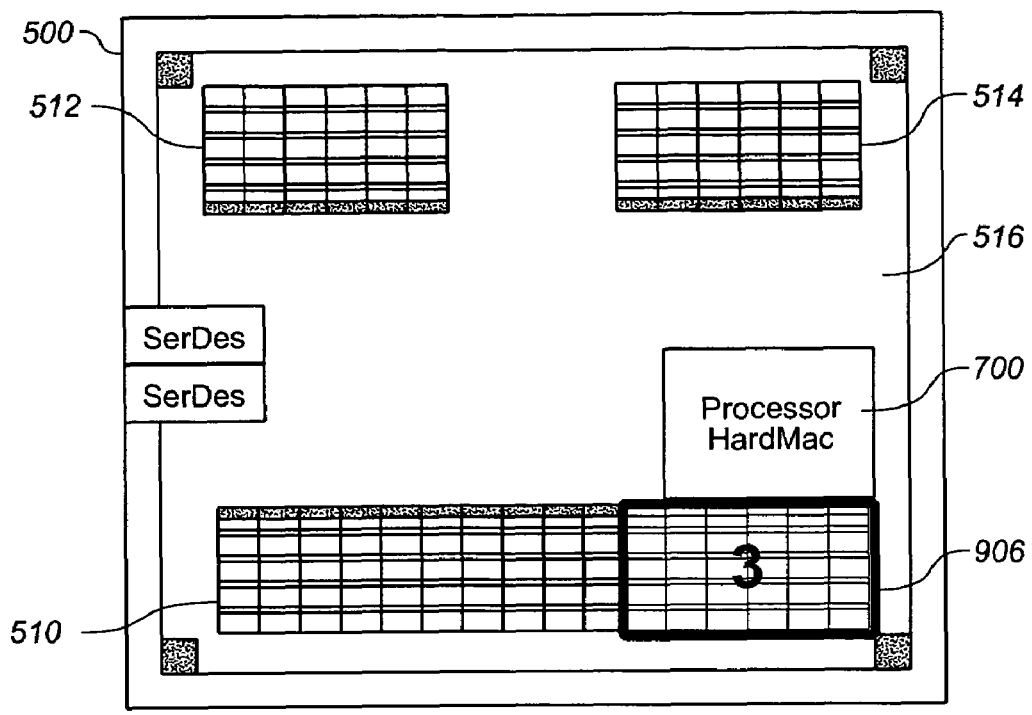
*FIG._11*
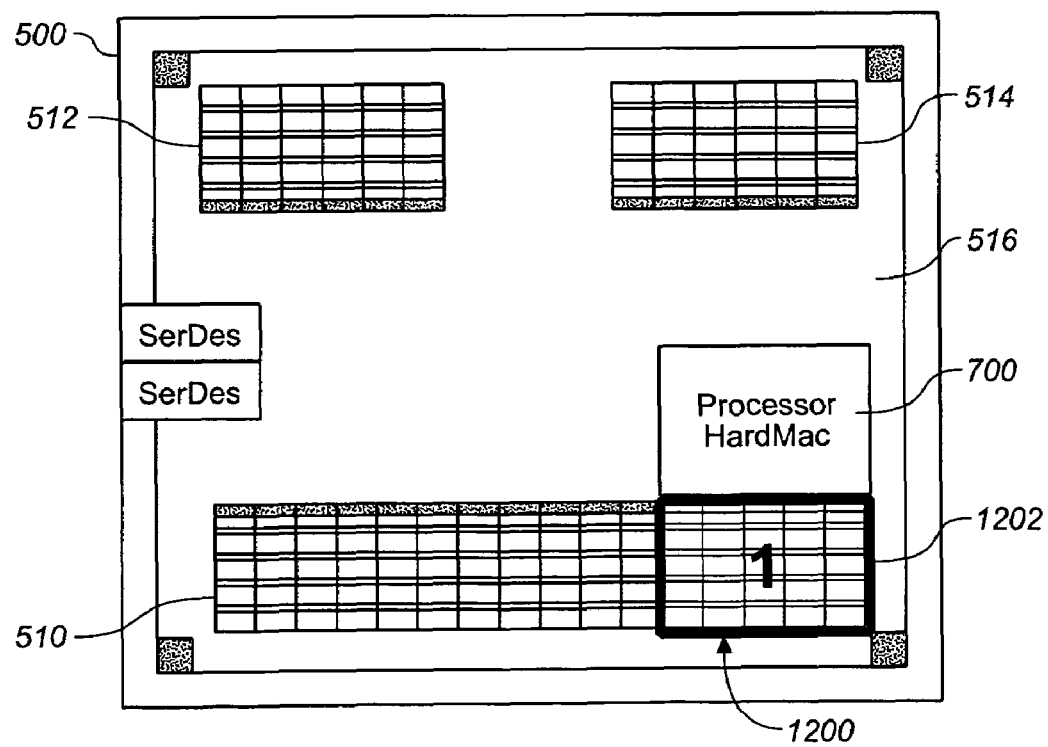
*FIG._12*

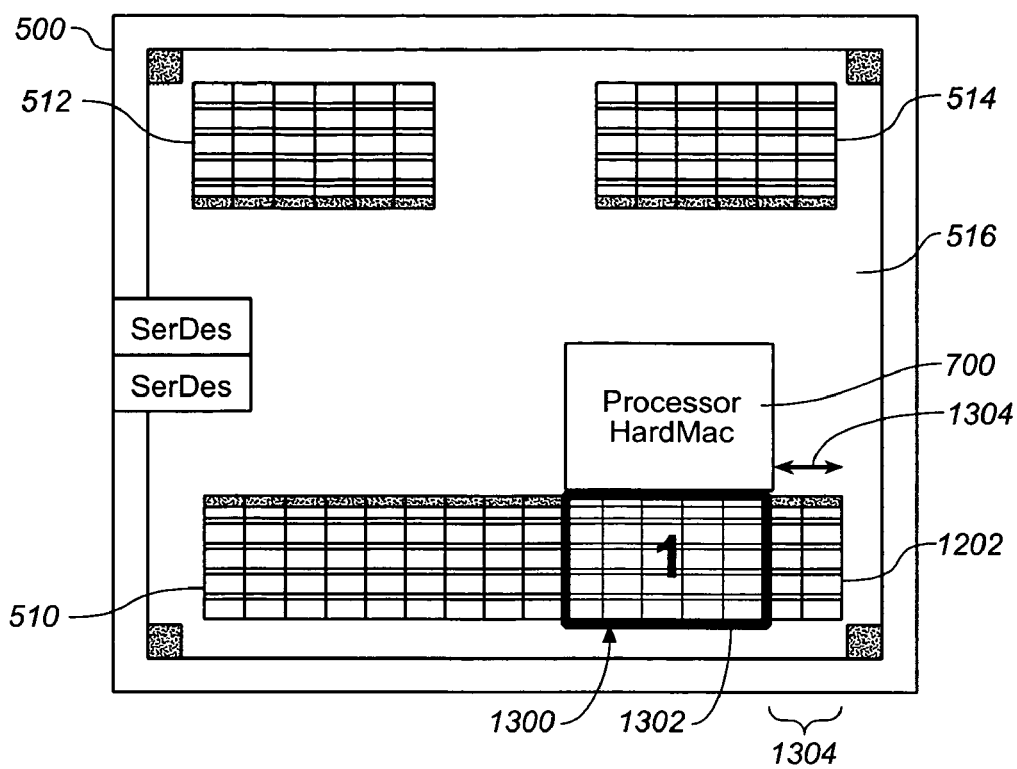
FIG._13
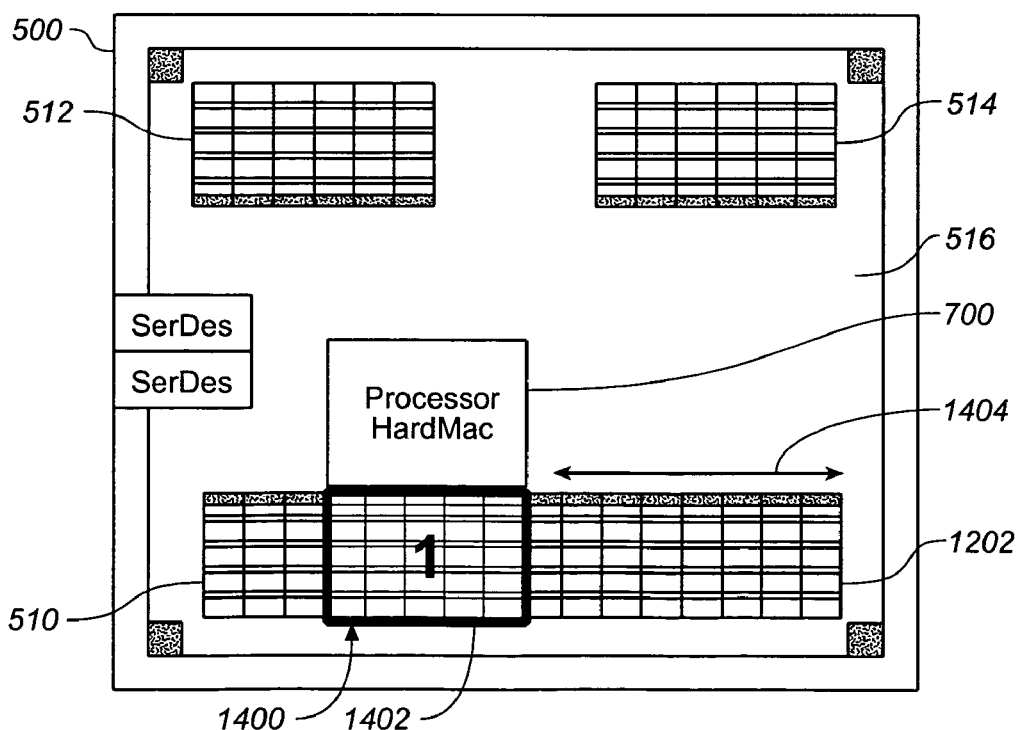
FIG._14

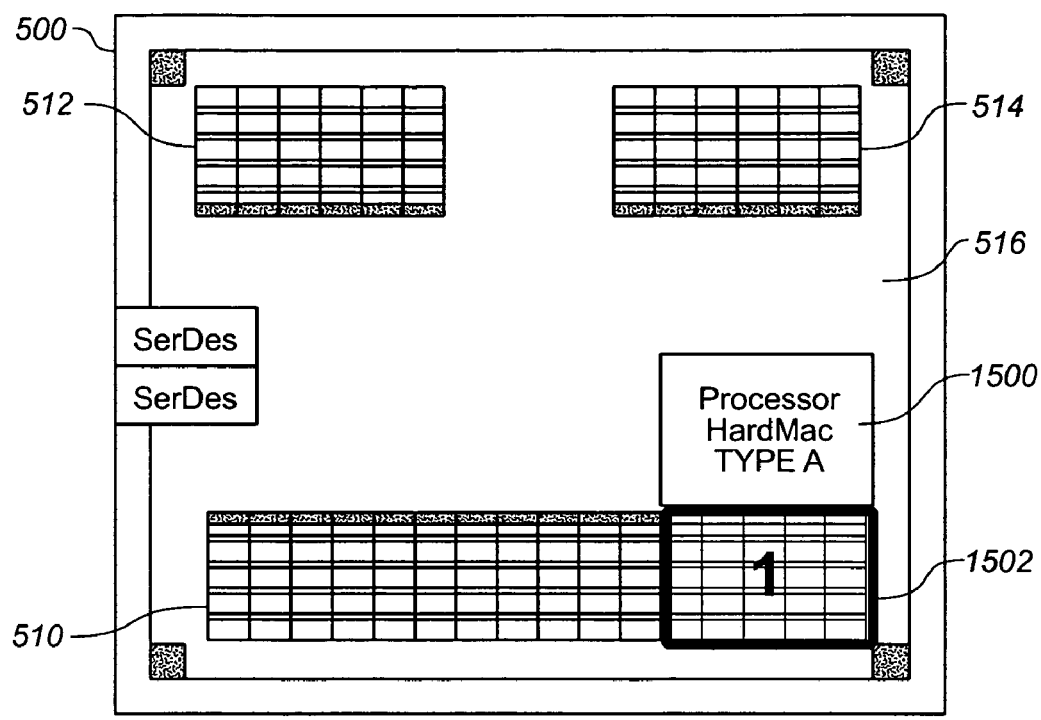
FIG._15
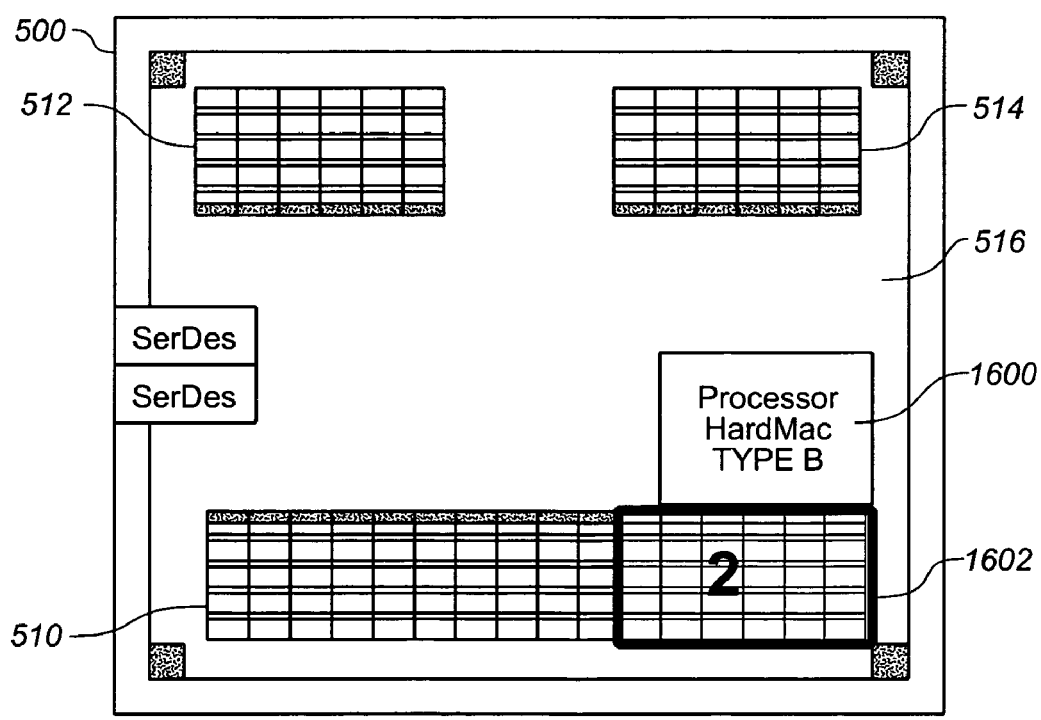
FIG._16

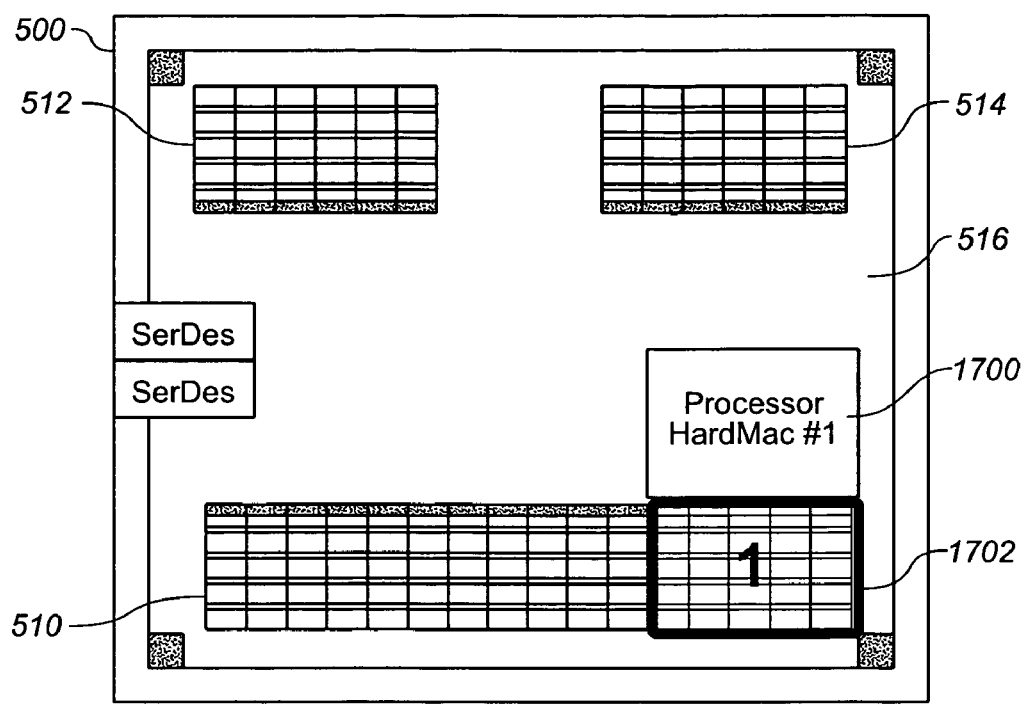
FIG._17
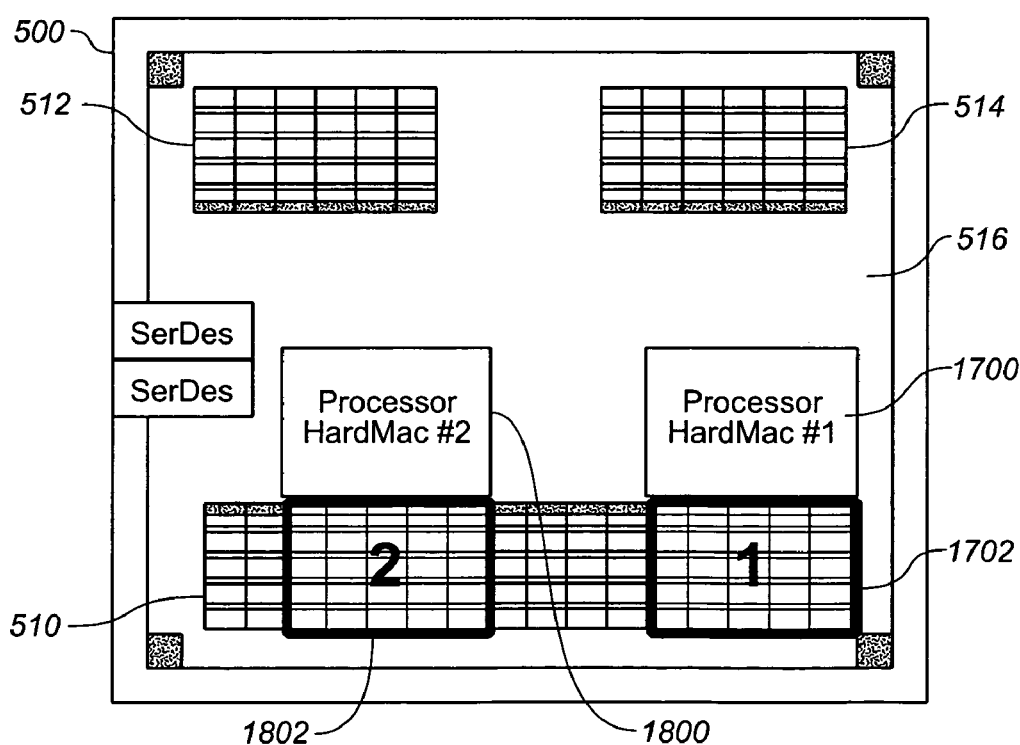
FIG._18

INTEGRATED CIRCUIT WITH RELOCATABLE PROCESSOR HARDMAC

CROSS-REFERENCE TO RELATED APPLICATION

The present application is related to the following U.S. patent applications, which are hereby incorporated by reference in their entireties: copending U.S. application Ser. No. 10/713,492, filed Nov. 14, 2003 and entitled FLEXIBLE DESIGN FOR MEMORY OF INTEGRATED CIRCUITS; and copending U.S. application Ser. No. 10/875,128, filed Jun. 23, 2004 and entitled YIELD DRIVEN MEMORY PLACEMENT SYSTEM.

FIELD OF THE INVENTION

The present disclosure relates to semiconductor integrated circuits such as ASICs and FPGAs. More particularly, the present disclosure relates to an integrated circuit design having a relocatable processor hard macro.

BACKGROUND OF THE INVENTION

Integrated circuits are generally fabricated on a thin silicon wafer or substrate. Semiconductor devices and electrical interconnections that form the integrated circuit are conventionally made by building many mask layers on top of one another on the substrate. Each successive mask layer may have a pattern that is defined using a mask. A mask has a shape used for patterning features in a particular process step during fabrication. The mask layers are fabricated through a sequence of pattern definition steps using the masks, which are interspersed with other process steps such as oxidation, etching, doping and material deposition. When a mask layer is defined using a mask chosen or provided by a customer, the mask layer is programmed or customized.

The lowest, "base" layers include the active areas of the semiconductor devices, such as diffusion regions and gate oxide areas, and desired patterns of the polysilcon gate electrodes. One or more metal and insulating layers are then deposited on top of the base layers and patterned to form conductive segments, which interconnect the various semiconductor devices formed in the base layers. Electrical contacts or vias are formed to electrically connect a conductive segment of one of the metal layers with a conductive segment or semiconductor device on one of the other layers on the wafer.

Several types of integrated circuits have been developed that have modules or blocks of transistors that are partly fixed and partly programmable and/or customizable. The utility of these modular chips is determined by factors such as complexity, cost, time, and design constraints to create functional electronics from these generic blocks of transistors. Field Programmable Gate Array (FPGA) refers to a type of logic chip in which all mask layers are pre-fabricated by an ASIC vendor and has a function that can be easily reprogrammed in the field with trivial modifications. FPGAs, however, are very large and have relatively high cost per function, relatively low speed, and high power consumption. An application specific integrated circuit (ASIC) is an integrated circuit designed specifically for a particular application or use. In a fully programmable ASIC, all mask layers are programmed or customized by the logic designer. A typical example of a fully programmable ASIC is a cell-based ASIC (CBIC). While a fully programmable ASIC efficiently uses power and area as compared to FPGAs, it is very complex to design and prototype. In a semi-programmable ASIC, some, but not all, mask layers are programmable. For example, some or all of the base layers are pre-fabricated by the ASIC vendor and the remaining layers, such as the metal layers, are programmed by the logic designer to interconnect the semiconductor elements to perform the desired function. A typical example of a semi-programmable ASIC is a gate-array-based ASIC. A semi-programmable ASIC can combine the high-density, high-performance benefits of standard-cell ASICs with the fast time-to-market and customization benefits of FPGAs.

Accordingly, semi-programmable ASICs have recently become more popular. Integrated circuit foundries have begun to develop standard, or base, platforms, known as "slices" containing the base layers of an integrated circuit but without the metal interconnection layers. The base layers are patterned to form gates that can be configured into cells using tools supplied by the foundry. The chip designer designs additional metal layers for the base platform to thereby configure the integrated circuit into a custom ASIC employing the customer's intellectual property. An example of such configurable base platform is the RapidChip® Platform available from LSI Logic Corporation of Milpitas, Calif. The RapidChip platform permits the development of complex, high-density ASICs in minimal time with significantly reduced design and manufacturing risks and costs.

The design effort for a semi-programmable ASIC encompasses several stages. After the chip size has been selected and the input-output (I/O) cells have been placed in a layout pattern for the base platform, megacells, including memories and other large hard macros (hardmacs), are placed. Thereafter, standard cells are placed to complete the chip design.

An embodiment of the present invention deals with the placement of processor cores or hardmacs in a design layout (for an ASIC or for an FPGA configuration) relative to the base platform and mapping memory from the design to standard or basic memories that are incorporated into the base platform. Consider a base platform containing basic sets of memories of a predetermined type, such as RRAMs. RRAMs are sets of memory of the same type that are placed compactly and have built-in testing and self-repairing capabilities. Usually, IC designers prefer not to use all the available memory sets of the RRAM so that unused memory sets are available for self-repairing processes. The base platform might also contain single memories such as single diffused memories. The design created by the IC designer may contain user-defined memories, herein, sometimes called customer memories, which are mapped into one or more of the pre-defined memory locations on the base platform.

Typically, a customer design includes one or more processors. A processor runs a sequence of stored instructions to perform tasks defined by a user program. Different instruction sets are used by different types of processors to complete the tasks defined in the program. For example, general purposes instruction sets are typical of microprocessors. Application specific instruction sets are used when it is required to speed up certain computational tasks. For example, a digital signal processor (DSP) embodies instruction sets that enhance computation of certain mathematical algorithms.

Also, different implementations of the same instruction sets are possible in hardware with different trade-offs of performance and resources. One of the common ways this difference arises is how much support memory is available and how that memory is organized. For example, a processor might utilize cache memory for enabling a large address space to be mapped onto a smaller one, by re-using addresses. Another processor might utilize a tightly coupled memory (TCM) having a fixed address space, which is sufficient for most critical instructions of the program.

During the design process, the support memory needed to support the processor is typically mapped to available memory locations that are pre-defined on the base platform, and the processor core is placed relative to the memory location.

SUMMARY OF THE INVENTION

One embodiment of the present invention is directed to an integrated circuit layout, which includes a base platform for an integrated circuit, a processor hardmac and a support memory. The base platform includes a memory matrix having leaf cells arranged in rows and columns. Each column of leaf cells has interface pins that are routed to a common matrix edge and have a common pin order along the matrix edge. The processor hardmac is placed along the memory matrix and has a hardmac edge adjacent the memory matrix edge and a plurality of interface pins for interfacing with corresponding interface pins of the memory matrix. The interface pins of the processor hardmac have substantially the same pin order along the hardmac edge as the interface pins along the matrix edge. The support memory for the processor hardmac is mapped to a portion of the memory matrix along the hardmac edge.

Another embodiment of the present invention is directed to a computer readable medium, which includes a representation of a base platform for an integrated circuit and a processor hardmac. The base platform includes a memory matrix having leaf cells arranged in rows and columns. Each column of leaf cells has interface pins that are routed to a common matrix edge and have a common pin order along the matrix edge. The processor hardmac has a hardmac edge and a plurality of interface pins for interfacing with corresponding interface pins of the memory matrix. The interface pins of the processor hardmac have substantially the same pin order along the hardmac edge as the interface pins along the matrix edge. The processor hardmac has a plurality of different valid placement locations along the matrix edge.

Another embodiment of the present invention is directed to a method of instantiating hardmacs in a layout pattern for a base platform for an integrated circuit. The method includes: receiving a base platform layout pattern, which comprises a memory matrix having leaf cells arranged in rows and columns, wherein each column of leaf cells comprises interface pins that are routed to a common matrix edge and have a common pin order along the matrix edge; placing a processor hardmac along the memory matrix, wherein the processor hardmac has a hardmac edge adjacent the memory matrix edge and a plurality of interface pins for interfacing with corresponding interface pins of the memory matrix, and wherein the interface pins of the processor hardmac have substantially the same pin order along the hardmac edge as the interface pins along the matrix edge; and mapping a support memory for the processor hardmac to a portion of the memory matrix along the hardmac edge.

BRIEF DESCRIPTION OF THE DRAWINGS

FIG. 1 is a simplified block diagram of a networked computer system with which the method and apparatus of the invention can be implemented.

FIG. 2 is a simplified block diagram of the functional components within a computer workstation with which an integrated circuit developer may access and use design tools in accordance with an embodiment of the invention.

FIG. 3 is a simplified block diagram of a semiconductor slice on which the design tools could allocate memory of an integrated circuit design in accordance with an embodiment of the invention.

FIG. 4 is a diagram illustrating a base platform slice 400 according to the prior art.

FIG. 5 is a diagram illustrating a slice having a plurality of memory matrices and a programmable transistor fabric, according to one embodiment of the present invention.

FIG. 6 is a diagram, which schematically illustrates one of the memory matrices in greater detail.

FIG. 7 is a diagram, which illustrates a processor hardmac instantiated within the transistor fabric of the base platform slice shown in FIG. 5, according to one embodiment of the present invention.

FIG. 8 is an enlarged view of the interface between a processor hardmac and a memory matrix, according to one embodiment of the present invention.

FIGS. 9-11 illustrate slices having different sizes of support memory allocated to a processor hardmac according to alternative embodiments of the present invention.

FIGS. 12-14 illustrate slices having different processor hardmacs placed at different locations along a memory matrix, according to alternative embodiments of the present invention.

FIGS. 15-16 illustrate slices having processor hardmacs, which implement different instruction sets, placed along a memory matrix and having different support memory requirements, according to alternative embodiments of the present invention.

FIGS. 17-18 illustrate slices having different numbers and types processor hardmacs, according to alternative embodiments of the present invention.

DETAILED DESCRIPTION OF ILLUSTRATIVE EMBODIMENTS

FIG. 1 illustrates an exemplary computer system 10 upon which one or more design tools for implementing an embodiment of the present invention could be installed or used.

Computer system 10 is illustrated as a networked computer system that includes one or more client computers 12, 14 and 20 such as workstations coupled through a network 18 to a server 16. Server 16 could also be a personal computer, a workstation, a midrange computer, or a mainframe computer. Network 18 represents any type of networked interconnection including but not limited to local-area, wide-area, wireless, and public networks such as the Internet or an Intranet.

Computer 20 may represent practically any type of computer, computer system, or other programmable electronic device, including a client computer similar to computers 12, 14 and 20 of FIG. 1, a server computer, e.g., similar to server 16 of FIG. 1, a portable computer, an embedded controller, a hand-held device, etc. Computer 20 may be coupled in a network as shown in FIG. 1 or may be a stand-alone device.

Computer 20 typically receives a number of inputs and outputs for communicating information externally. For interface with a user or operator, computer 20 typically includes one or more user input devices 26, 27, e.g., a keyboard, a mouse, a trackball, a joystick, a touchpad, and/or a microphone, among others, and a display 22 such as a CRT monitor, an LCD display panel, and/or a speaker, among others. For additional storage, computer 20 may also include one or more storage devices 36, e.g., a floppy or other removable disk drive, a hard disk drive, a direct access storage device, an optical drive, e.g., a CD drive, a DVD drive, etc., and/or a tape drive, among other computer-readable mediums, that may be connected directly or may be connected through a storage area network (SAN) or other network. Furthermore, computer 20 may include an interface connected to one or more networks 18, e.g., a local-area network, a wide-area network, a wireless network, and/or the Internet, among others, to permit communication of information with other computers coupled to the network.

FIG. 2 is a block diagram of computer 20 upon which the methods and apparatus of various embodiments of the present invention can be installed as one or more applications.

Computer 20 typically includes at least one processor 30 coupled to a memory 32. Processor 30 may represent one or more processors or microprocessors and memory 32 may represent the random access memory (RAM) devices comprising the main storage of computer 30, as well as any supplemental levels of memory such as cache memories, nonvolatile or backup memories, programmable or flash memories, read-only memories, etc. In addition, memory 32 may be considered to include memory storage physically located elsewhere in computer 30, e.g., any storage capacity used as a virtual memory, e.g., as stored on a mass storage device 36 coupled to computer 20 with a SAN or on another computer coupled to computer 20 via network 18.

Computer 20 may operate under the control of any suitable operating system 40. Operating system 40 typically executes various computer software applications, components, programs, objects, modules, etc., such as an executable program 42 and/or other components 44. Although the design tools 50 used to implement one or more embodiments of the present invention may be in memory 32 for the purpose of developing an integrated circuit, they need not be. The processor 30 may access the tools, the required data, other various applications components, programs, objects, modules, etc., resident on one or more processors in another computer coupled to computer 20 via a network 18, e.g., in a distributed or client-server computing environment whereby the processing to implement the functions of the memory allocation tool may be allocated to multiple computers over a network.

In general, the various tools 50 executed to implement one or more of the embodiments of the invention are referred to as design tools, whether implemented as part of an operating system or a specific application, database, component, program, object, module or sequence of instructions. The design tools typically comprise one or more instructions or databases that are resident at various times in various memory and storage devices in a computer, and that, when read and executed by one or more processors in a computer network, cause that computer to perform the instructions and/or process the databases embodying the various aspects of the invention. Examples of computer readable media on which such instructions can be stored include but are not limited to recordable type media such as volatile and nonvolatile memory devices, floppy and other removable disks, hard disk drives, optical disks, e.g., CD-ROMs, DVDs, etc., among others, and transmission type media such as digital and analog communication links. The exemplary environments illustrated in FIGS. 1 and 2 are not intended to limit the present invention.

FIG. 3 is a diagram, which schematically illustrates a base platform or slice 310 of a partially manufactured semiconductor device in which the base wafer layers up to the connectivity layers have been fabricated. Slice 310 includes a base semiconductor wafer into which hardmacs and other semiconductor devices have been diffused into the semiconductor layers. Diffusing a semiconductor wafer to create a hardmac simply means that during fabrication of the wafer layers, transistors or other electronic devices have been particularly and permanently embedded or otherwise arranged in the wafer layers to achieve specific functions, such as diffused memory 320-338 and 380-390, data transceiver hardware such as I/O PHYs 340-346, clock factories including phase locked loops (PLLs) or delay locked loops (DLLs) 350, control I/Os 352, and configurable input/output (I/O) hardmacs 354 and 356. Each of the hardmacs have an optimum density, arrangement, and routing of transistors for its particular function.

The slice further includes a gate array of transistors, called transistor fabric 360, for further development. Transistor fabric 360 is an array of prediffused transistors in a regular pattern that can be logically configured by configuring the metal layers interconnecting the transistors by a suite of generation tools. For example, the tools may be used place one or more, and typically thousands, of cells onto the transistor fabric from a cell library. A cell refers to the personalization of the interconnect layers that instantiate a logic gate of the transistor fabric. A typical slice 310 also typically includes an embedded processor 370 that may be connected to other components of the slice on a bus network 375. Embedded processor 370 is electrically coupled to a set of support memories embedded in the base platform for the slice.

The slice definition thus is a detailed listing of all the features available on the slice, such as the transistor fabric, a specification of a processor or processing element or processing circuit, the configurable and/or hardmac I/O and memory available, the requirements of the configurable and hardmac I/Os, an internal bus specification, the cost of the slice, the ideal performance that can be expected of the slice, the expected power consumption, and other functional requirements.

The slice 310 shown in FIG. 3 is only one example of a slice and its components. Different slices may contain different amounts of transistor fabric, different amounts and types of diffused and/or compiled memories, different types of fixed and configurable I/O blocks, different types and amounts of I/O hardmacs, processors, clocks, etc. depending upon the purpose of the final integrated chip. For instance, if the final chip is intended to be a communication and/or networking integrated circuit, the periphery of the slice may contain many I/O blocks that have been fixed as PHYs and/or that can be configured differently from one another. The base platform for slice 310, moreover, optionally may include the contact mask and some of the fixed higher layers of connectivity for distribution of power, ground, and external signal I/O.

The slice itself can be defined by register transfer logic (RTL) or a netlist, for example. The collection of RTL logic are categorized into "shells" and can include a documentation shell, a verification shell, a synthesis shell, a static timing analysis shell, and a manufacturing test shell, all of which provide input and/or contain output from one or more of the design tools. The RTL shell provides a logical description of an aspect of the slice or of the generated or used resources. The documentation shell may be considered the functional description of the resources. The verification shell is the functional verification description, whereas the synthesis shell may be thought of as the generation description. The static timing analysis shell is the timing description, the manufacturing test shell is the test description, and the floorplan shell is a description of the location of the slice resources. Additional shells may include the floorplan shell and the RTL qualification shell.

FIG. 4 is a diagram illustrating a base platform slice 400 according to the prior art. Core regions of today's slice architecture are dominated by arrays of fixed random access memory (RAM) instances 410, 412, 414, 416 and 418, for example. Each RAM instance is self-contained and has its own built-in self-test (BIST) circuitry, decoupling capacitances and hard macro that snaps to locations in the layout floorplan. However, having each RAM instance being self-contained results in inefficient use of area on the floorplan. The self-contained RAM instances do not share overhead circuitry and result in a lower effective bit density per instance. Also, the use of self-contained RAM instances can result in a "Swiss-cheese" floorplan in which the instances are distributed throughout the floorplan. This complicates routing and placement of other devices that interface with the RAM instances. Also, there can be a trade-off between the number of bits per instance and the number of instances in a particular slice floorplan.

It has therefore been proposed that all RAM resources be consolidated in a number of small regions called matrices to share overhead and reduce area wastage. An example of a memory matrix is described in U.S. application Ser. No. 10/875,128, filed Jun. 23, 2004 and entitled YIELD DRIVEN MEMORY PLACEMENT SYSTEM, and U.S. Pat. No. 6,804,811 entitled PROCESS FOR LAYOUT OF MEMORY MATRICES IN INTEGRATED CIRCUITS, which are hereby incorporated by reference.

FIG. 5 is a diagram illustrating a slice 500 having a plurality of memory matrices 510, 512 and 514 and a programmable transistor fabric 516. Each memory matrix packs identical custom RAMS (for example) for maximum possible density. Slice 500 therefore has a floorplan, which separates logic and memory in order to provide a smaller die size and faster migration of an ASIC design to the slice resources.

FIG. 6 is a diagram, which schematically illustrates one of the matrices 510 in greater detail. In this example, memory matrix 510 includes a plurality of RAM leaf cells 520 arranged in rows and columns. In one embodiment, each leaf cell 520 in a given matrix is identical to the other leaf cells in the matrix. A leaf cell is defined as an array or other regular pattern of individual memory cells, which can include one or more row bits and one or more column bits. For example, each leaf cell can be defined by the slice architect to have any configuration (words×bits). For example, each leaf cell can be configured to form a 2K×20, 512×20 or 256×40 memory. In one embodiment, each leaf cell is identical to the other leaf cells in the matrix.

Each memory matrix 510 can further include decoupling capacitors 522 between rows of leaf cells 520 and can include a common built-in self-test (BIST) and/or built-in self-repair (BISR) circuit 524. A memory matrix containing a BIST, a BISR or a similar test or repair circuit can be referred to as an RRAM memory matrix.

In one embodiment, all signal interface pins (such as address, data and control) of memory matrix 510 are assigned and placed along a common edge of the matrix, which can be referred to as an interface channel 526. Channel 526 is preferably placed along the edge of the matrix that is adjacent to the programmable transistor fabric 516, as shown in FIG. 5. During the design of slice 500, a channel controller routes the RRAM signal interface pins to the edge to create many columns of "virtual" RAMs. A logic design can use as many virtual RAMs in the memory matrix as is desired up to the total number of "leaf cells" 520 in the matrix. The logic designer can specify the width and depth of each virtual RAM.

Slice floorplans based on RRAM memory matrices address many of the issues associated with existing fixed instance slice floorplans. Memory matrices share overhead circuitry such as decoupling capacitors and built-in self-test. Also, since each memory matrix is formed by densely packed leaf cells, there is no "snap to grid" area losses inside the memory matrix. This maximizes memory density within the matrix. A memory matrix also achieves better matching of the memory requirements of a particular circuit design against available resources.

Referring back to FIG. 5, the transistor fabric 516 can be configured to implement a desired logic function. As described above, a typical integrated circuit design includes one or more processors that interface with one or more of the memory instances on the semiconductor slice. One embodiment of the present invention provides a relocatable processor hardmac that can be placed in the transistor fabric 516 relative to a memory matrix on a base platform slice, such as matrix 510, and can be configured to implement one or more different types of processors with minimal or no preconditions on the processor instruction set, support memory needs of the processor, number of processors instantiated on the slice, or the absolute location of the processor in the floor plan.

In the context of an ASIC, a hardmac defines the metal layers of the integrated circuit chip in a particular region (such as the transistor fabric) in order to perform a particular logical function with known timing characteristics. During placement, a hardmac snaps to a specific location in the slice floorplan relative to a predetermined origin of the hardmac.

A processor runs a sequence of stored instructions to perform tasks defined by a user program. Different instructions sets are used by different types of processors to complete the tasks defined in the program. For example, a general purpose instruction set is typical of a microprocessor. Application specific instructions sets are used when it is required to speed up certain computational tasks. For example, a digital signal processor (DSP) embodies instruction sets that enhance computation of certain mathematical algorithms.

Different implementations of the same instructions sets are also possible in hardware. Each has a different trade-off of performance and resources. For example, the hardware implementation of a processor can vary depending on how much support memory is available on the slice and how that memory is organized. There are many different types of support memory and usages. For example, cache memory enables a large address space to be mapped onto a smaller one be re-using addresses. A tightly coupled memory (TCM) uses a fixed address space, which is sufficient for most critical instructions of the program. Also, a TCM memory has a more direct connection to the processor to allow memory accesses to be performed within a small number of clock cycles.

There are many methods for implementing a cache, which usually depending on the architecture of the processor. In a typical implementation, a cache may comprise three sub-arrays, which in some implementations can be referred to as a data array, a tag array and a way select array. The purpose of the data array is to store local (cached) copies of data present at a given address or set of addresses in a larger memory space. The degree to which addresses can be re-used in a data array is sometimes referred to by its "set associativity", examples being "2-way set associative" or "4-way set associative".

In a 4-way configuration, there are four alternative locations wherein an entry may be stored. The index of an entry in the data array is usually formed from a number of its low order address bits. The remaining high order address bits usually are used to form part of what is referred to as a "tag". A tag may include other bits of information describing other attributes of an entry in the data array. For example, whether the entry is valid or not, or whether it is locked. The tag array stores the tags associated with entries contained in the data array. The meaning and interpretation of such attribute bits in a tag are a function of a cache controller.

The way select array is typically used by a cache controller to store housekeeping information as may be required to store and retrieve entries in the data array. For example in a 4-way set associative cache, the way select array would typically contain information relating to which one of four alternative locations in the data array should be referenced. Depending on the algorithms and policies implemented by the cache controller, other bits of information may be present in the way select array. For example a "dirty" bit (or flag) signifies that the contents of a cache entry have been modified, so that when this entry in the cache needs to be replaced, the entry's contents should be copied back to the original location in the larger address space.

A cache controller is responsible for managing the contents and accesses to a cache. It implements algorithms for storing and looking up valid entries in the cache and for implementing policies on when an entry should be replaced. The large number of possible variations means there can be considerable diversity in the number of words and bits per word used by memories to implement the sub-arrays of a cache.

For a base platform slice to be adaptable to many varied applications, such as those discussed above, it is highly desirable to have the flexibility to include processor cores in a platform ASIC design with minimal preconditions on the instruction set, the support memory needs the processor, the number of processors or the absolute location of the processor in the floorplan. Also, it is desirable for such processors to have known, predetermined performance characteristics.

FIG. 7 is a diagram, which illustrates a processor hardmac 700 instantiated within the transistor fabric 516 of a layout pattern for base platform slice 500 (shown in FIG. 5) relative to memory matrix 510. Processor hardmac 700 is placed adjacent to interface channel 526 of memory matrix 510 to facilitate interconnections between the interface pins of the memory elements and corresponding pins in processor hardmac 700. In one embodiment, the corresponding interface pins in processor hardmac 700 are aligned along edge 702 in the same order as the interface pins appear along channel 526.

One or more tiles (leaf cells) are allocated to processor hardmac 700 from memory matrix 510 when the support memory for the processor hardmac are mapped to a portion of memory matrix 510 along hardmac edge 702. These tiles together form a "set" of specific width and depth. In FIG. 7, processor hardmac 700 has been allocated a plurality of sets [1 . . . n]. Each set can have any number of rows and columns of leaf cells. The number of sets [1 . . . n] required by an implementation of a cache or TCM memory form the "support memory" for processor hardmac 700. The processor support memory is therefore logically part of the processor hierarchy but physically implemented in memory matrix 510. The number of sets and the widths and depths of these sets can vary depending on the implementation of a given support memory. Allocation of the sets of leaf cells can be performed as described in U.S. application Ser. No. 10/875,128, filed Jun. 23, 2004 and entitled YIELD DRIVEN MEMORY PLACEMENT SYSTEM, incorporated by reference above, for example.

The support memory can be configured as any type of memory needed by processor hardmac 700, such as a register, a cache, a TCM and/or as described in U.S. application Ser. No. 10/713,492. The functionality of a cache or a TCM typically comprises a set of memories, and the logic interconnections are usually described by RTL. The sets [1, 2, . . . n] of the support memory are assigned to data, tags, valid bits etc. as required by the cache architecture, the cache associatively, the cache size and/or the TCM size.

With the embodiment described above, the flexibility in choice of size of the support memory (e.g., cache, or TCM) is not limited to specific configurations determined at the time the slice is created. In contrast to prior memory allocation tools, the flexibility and choice of size of the support memory is not constrained by a superset (or largest common memory) of a predetermined set of processors.

The ordering of the memory sets (and therefore the RAM pin locations and pin ordering) is specific along the interface channels of the memory matrices. In an embodiment of the present invention, the corresponding pin locations and pin ordering are placed and arranged along edge 702 of hardmac 700 to match substantially the ordering along channel 526 of memory matrix 510. As a result, the ordering of one or more of the data, address and/or control pins in each memory set and from one set to the next substantially match the order of corresponding pins along edge 702 of processor hardmac 700. The wiring between processor hardmac 700 and its support memory is therefore trivial and is not a strong function of the number and type of tiles used to implement the support memory.

FIG. 8 is an enlarged, fragmentary view of the interface between processor hardmac 700 and memory matrix 510 according to one embodiment of the present invention. Memory matrix 510 has a plurality of columns 800 (800-0 and 800-1 shown in FIG. 8) of leaf cells. Each column 800 of leaf cells has a plurality of signal interface pins 804, which are routed to channel interface 526 along a common edge 802 of matrix 510. These interface pins can include, for example, data, address and control pins. In the example shown in FIG. 8, column 800-0 includes data pins DATA0[n:0], address pins ADR0[m:0] and control pins CNTL0[p:0] and column 800-1 includes data pins DATA1[n:0], address pins ADR1[m:0] and control pins CNTL1[p:0].

The signal interface pins 804 in each column 800 of matrix 510 have a predefined order along matrix edge 802, and that order is the same for each column 800 of leaf cells in the matrix. Any order can be used, and pins of one type can be interleaved or mixed with pins of other types. Also, the interface pins 802 can be located on any layer of the integrated circuit, and individual pins can be on the same layer or different layers than the other pins.

In one embodiment, processor hardmac 700 has a plurality of interface pins 704 for interfacing with corresponding interface pins 804 of memory matrix 510. Interface pins 704 are routed to the edge 702 of hardmac 700 and have the same pin order as pins 804. This makes the task of routing the interconnections (represented by dashed lines 806) a trivial task and independent of the size of the support memory or type of processor implemented by hardmac 700. The pin pitch of hardmac pins 704 does not have to be the same as that for memory matrix pins 804. However, it is preferred that the pin order remain the same so that the size, arrangement and type of the support memory and the size, instruction set and type of processor can be easily varied from one embodiment to the next while still using the same slice architecture.

FIGS. 9-11 illustrate that slice 500 is adaptable to provide variation in the size of the support memory that is allocated to a particular processor hardmac 700 (or different types of processor hardmacs 700). FIG. 9 illustrates an embodiment of slice 500 in which a portion 902 of memory matrix 510 is assigned as support memory for hardmac 700. The support memory can be allocated as any type of memory, such as a cache, TCM or both. Portion 902 can include one or more sets or tiles of leaf cells, as shown in FIG. 7. FIG. 9 illustrates memory portion 902 having four columns of leaf cells.

FIG. 10 illustrates an embodiment of slice 500 in which a portion 904 of memory matrix 510 is assigned as support memory for hardmac 700, which is larger than portion 902. Again, the support memory can be allocated as any type of memory, such as a cache, TCM or both, but the cache size (or TCM size) is different than that shown in FIG. 9. In this example, memory portion 904 has five columns of leaf cells.

FIG. 11 illustrates an embodiment of slice 500 in which a portion 906 of memory matrix 510 is assigned as support memory for hardmac 700, which is larger than portions 902 and 904. Again, the support memory can be allocated as any type of memory, such as a cache, TCM or both, but the cache size (or TCM size) is different than that shown in FIGS. 9 and 10. The size of the support memory assigned to processor hardmac 700 can be increased as needed up to the total number of columns of leaf cells in the memory matrix. The size of the support memory is not limited to specific configurations determined at the time the slice is created.

FIGS. 12-14 illustrate that the location of processor hardmac 700 within the floorplan along memory matrix 510 is not limited to specific locations determined at the time slice 500 is created. This allows the location to be selected to better suit data flow in a particular chip floorplan. Processor hardmac 700 has a first position in FIG. 12 and is assigned support memory 1200 from memory matrix 510. The starting column for the first pins of first set of leaf cells in support memory 1200 is aligned with the first column 1202 of memory matrix 510.

In FIG. 13 processor hardmac 700 has a second, different position within the floorplan of slice 500 and is assigned support memory 1300 from memory matrix 510. Again, support memory 1300 can have any number of sets having any width and depth. Support memory 1300 is mapped to memory matrix 510 so that the starting column (indicated generally by arrow 1302) for the first pins of the first set (or column) of support memory 1300 are offset (shifted to the left) from the first column 1202 of memory matrix 510 by an integral number of columns 1304. The amount of offset generally corresponds to the placement location of processor hardmac 700.

In FIG. 14, processor hardmac 700 has a third placement location along memory matrix 510, which is different than those in FIGS. 12 and 13. In this embodiment, processor hardmac 700 is assigned support memory 1400 within memory matrix 1104. Support memory 1400 can have any number of sets having any width and depth. The starting column (indicated generally by arrow 1304) for the first pins of the first set of support memory 1400 are shifted to the left from the first column 1202 of memory matrix 510 by an integral number of columns 1404.

Because of the relative (not absolute) locations of processor hardmac 700 and its corresponding support memory are fixed, performance and timing characteristics do not change. The wiring interconnections between processor hardmac 700 and its support memory also remain trivial.

In addition, the type of processor that can be implemented on base platform slice 500 is not constrained by a fixed set of resources. FIGS. 15 and 16 show the use of two different types of processor hardmacs in accordance with embodiments of the present invention. In FIG. 15, a processor hardmac 1500 having an instruction set type "A" is placed along memory matrix 510 and is assigned a memory portion 1502 as support memory. Again, support memory 1502 can be assigned to any type of memory such as a cache memory and/or a TCM. In FIG. 16, a processor hardmac 1600 having an instruction set type "B", which is different than type "A", is placed along memory matrix 510 and is assigned a memory portion 1602 as support memory. The hardmac used to implement instruction set "B" does not need to be the same height or width as the one for instruction "A". The number or size of memory sets in portion 1602 is not constrained by the requirements of type "A". The assignment of support memory for processor hardmac type "B" is independent of other types of processors that can be instantiated on slice 500. This allows a wide variety of processors to be supported by the same slice architecture.

FIGS. 17 and 18 illustrate variation in the number and type of processors that can be instantiated on the same slice architecture in accordance with embodiments of the present invention. FIG. 17 illustrates a single processor hardmac 1700 placed along memory matrix 510 and having assigned support memory 1702. Processor hardmac 1700 implements a first instruction set. FIG. 18 illustrates first and second processor hardmacs 1700 and 1800 placed along memory matrix 510. Processor hardmac 1700 has assigned support memory 1702, while processor hardmac 1800 has assigned support memory 1802. Processor hardmac 1700 implements a first instruction set, and processor hardmac 1700 implements a second instruction set. The instruction set and/or cache size (and/or TCM size) of processor hardmac 1700 can be the same as or different than those of processor hardmac 1800. FIGS. 17 and 18 therefore illustrate flexibility in the choice of instruction sets and sizes of cache/TCM memories, which are not limited to specific configurations determined at the time the slice is created.

As described above, a processor hardmac can be used to "snap" onto pins of "virtual memories" created from a memory matrix along the edge of its I/O channel. Since the processor architecture is implemented in a hardmac, it is not fixed at the time the slice is created. The particular processor architecture can be determined by the customer and fixed at the time the higher-level layers of the integrated circuit are fabricated without preconditions on the instruction set. The processor hardmac is not constrained to use predefined amounts of memory in fixed locations. This permits a method to vary the size and configuration of the support memory for a processor as needed, without having to create a new slice architecture. The performance that can be obtained by a particular integrated circuit design depends on the technology selected as well as the processor architecture. The number and/or locations of processor hardmacs are not predefined. Multiple processors can be supported without creating a new slice. The regular nature of the memory matrix allows a processor hardmac to be snapped onto multiple valid locations along the matrix. This allows improvements to data flows in floorplans.

One or more embodiments of the present invention can be implemented in a variety of different semiconductor technologies, fabrication processes and methodologies. For example, some of the embodiments discussed above are presented in the context of a semi or fully programmable ASIC. In these embodiments, the base platform corresponds to base layers of a partially manufactured Application Specific Integrated Circuit (ASIC) slice. The processor hardmac at least partially defines an interconnect or wiring pattern within at least one metal layer to be fabricated on the integrated circuit slice. The interconnect pattern is arranged to implement the logic of the desired processor configuration and/or instruction set within the transistor fabric, for example, of the slice. For a semi-programmable ASIC, the base platform can be manufactured prior to selecting the instruction set for the processor hardmac, the placement location of the processor hardmac in the slice floorplan, or defining the type, size or mapping of the processor support memory. An example of a semi-programmable ASIC with a metal configurable base platform is the RapidChip® Platform available from LSI Logic Corporation of Milpitas, Calif.

One or more embodiments can also be implemented in a Field-Programmable Gate Array (FPGA). In the context of an FPGA, the base platform corresponds to a fully manufactured Field-Programmable Gate Array (FPGA) having a memory matrix. The processor hardmac represents a logical placement of a processor in the reconfigurable fabric of the FPGA relative to the memory matrix. For example, the processor hardmac can represent a set of FPGA configuration bits or states that define a processor function within the FPGA floorplan and define signal routing for the processor within the floorplan, relative to the memory matrix. Other applications also exist.

Although the present invention has been described with reference to preferred embodiments, workers skilled in the art will recognize that changes may be made in form and detail without departing from the spirit and scope of the invention. For example, the terms "row" and "column" are interchangeable.

What is claimed is:

1. An integrated circuit layout comprising:
   a base platform for an integrated circuit, the base platform comprising a memory matrix having leaf cells arranged in rows and columns, wherein each column of leaf cells comprises interface pins that are routed to a common matrix edge and have a common pin order along the matrix edge;
   a first processor hardmac placed along the memory matrix and having a hardmac edge adjacent the memory matrix edge and a plurality of interface pins for interfacing with corresponding interface pins of the memory matrix, wherein the interface pins of the first processor hardmac have substantially the same pin order along the hardmac edge as the interface pins along the matrix edge; and
   a first support memory for the processor hardmac, which is mapped to a portion of the memory matrix along the hardmac edge.

2. The integrated circuit layout of claim 1, wherein:
   the base platform corresponds to base layers of a partially manufactured Application Specific Integrated Circuit (ASIC) slice; and
   the first processor hardmac at least partially defines an interconnect pattern of at least one metal layer to be fabricated on the integrated circuit slice.

3. The integrated circuit layout of claim 1, wherein:
   the base platform corresponds to a fully manufactured Field-Programmable Gate Array (FPGA); and
   the first processor hardmac represents a logical placement of a processor in reconfigurable fabric of the FPGA.

4. The integrated circuit layout of claim 1 wherein the first support memory is mapped to a corresponding set of columns of the leaf cells along the hardmac edge.

5. The integrated circuit layout of claim 1 wherein the first processor hardmac has a plurality of different valid placement locations along the matrix edge and wherein for each placement location, the first support memory has a starting column, which is offset from one end of the memory matrix by an integral number of columns of leaf cells.

6. The integrated circuit layout of claim 1 wherein the first support memory has a size that is unconstrained to a predefined set of sizes by the base platform, wherein the predefined set of sizes correspond to predefined configurations for the first processor hardmac.

7. The integrated circuit layout of claim 1 wherein the first processor hardmac has a width, which is independent of the size of the first support memory.

8. The integrated circuit layout of claim 1 wherein the integrated circuit layout comprises a plurality of programmable routing layers and the first processor hardmac comprises a plurality of different configurations corresponding to different processor instruction sets, the configurations being configurable at least in part by the programmable routing layers.

9. The integrated circuit layout of claim 8, wherein the different processor instruction sets are unconstrained by predefined configurations of the memory matrix for to predefined instruction sets, other than by the size of the memory matrix.

10. The integrated circuit layout of claim 1 and further comprising:
    a second processor hardmac placed along the memory matrix and having a hardmac edge adjacent the memory matrix edge and a plurality of interface pins for interfacing with corresponding interface pins of the memory matrix, wherein the interface pins of the second processor hardmac have the same pin order along the corresponding hardmac edge as the interface pins along the matrix edge; and
    a second support memory for the second processor hardmac, which is mapped to an additional portion of the memory matrix along the corresponding hardmac edge.

11. The integrated circuit layout of claim 10 wherein the second processor hardmac has a different instruction set than the first processor hardmac.

12. The integrated circuit layout of claim 10 wherein the second support memory has a different size than the first support memory.

13. A computer readable medium having stored thereon a plurality of instructions which, when executed, generate a representation of a layout comprising:
    a base platform for an integrated circuit, the base platform comprising a memory matrix having leaf cells arranged in rows and columns, wherein each column of leaf cells comprises interface pins that are routed to a common matrix edge and have a common pin order along the matrix edge; and
    a processor hardmac having a hardmac edge and a plurality of interface pins for interfacing with corresponding interface pins of the memory matrix, wherein the interface pins of the processor hardmac have substantially the same pin order along the hardmac edge as the interface pins along the matrix edge, and wherein the processor hardmac has a plurality of different valid placement locations along the matrix edge.

14. The computer-readable medium of claim 13, wherein:
the base platform corresponds to base layers of a partially manufactured Application Specific Integrated Circuit (ASIC) slice; and
the first processor hardmac at least partially defines an interconnect pattern of at least one metal layer to be fabricated on the integrated circuit slice.

15. The computer-readable medium of claim 13, wherein:
the base platform corresponds to a fully manufactured Field-Programmable Gate Array (FPGA); and
the first processor hardmac represents a logical placement of a processor in reconfigurable fabric of the FPGA.

16. The computer readable medium of claim 13 and further comprising:
a support memory for the processor hardmac, which is mapped to a corresponding set of columns of the leaf cells along the hardmac edge, wherein for each placement location, the support memory has a starting column, which is offset from one end of the memory matrix by an integral number of columns of the leaf cells.

17. The computer readable medium of claim 16 wherein the support memory has a size that is unconstrained by the base platform to a predefined set of sizes corresponding to predefined configurations for the processor hardmac.

18. The computer readable medium of claim 13 and further comprising representations of a plurality of programmable routing layers for fabrication on the base platform, wherein the processor hardmac comprises a plurality of different configurations corresponding to different processor instruction sets, the configurations being configurable at least in part by the programmable routing layers, and wherein the different processor instruction sets are unconstrained by predefined configurations of the memory matrix.

19. The computer readable medium of claim 13 and further comprising representations of:
first and second instantiations of the processor hardmac along the matrix edge within a layout pattern for the base platform; and
first and second support memories for the first and second instantiations of the processor hardmac, which are mapped to corresponding sets of columns of the leaf cells along the respective hardmac edges, wherein each support memory has a starting column, which is offset from one end of the memory matrix by a respective integral number of columns of the leaf cells.

20. The computer readable medium of claim 19 wherein the first instantiation of the processor hardmac implements a different instruction set than the second instantiation of the processor hardmac.

21. The computer readable medium of claim 19 wherein the first support memory has a different size than the second support memory.

22. A method of implementing hardmacs on a base platform for an integrated circuit, the method comprising:
receiving a base platform, which comprises a memory matrix having leaf cells arranged in rows and columns, wherein each column of leaf cells comprises interface pins that are routed to a common matrix edge and have a common pin order along the matrix edge;
placing a processor hardmac along the memory matrix, wherein the processor hardmac has a hardmac edge adjacent the memory matrix edge and a plurality of interface pins for interfacing with corresponding interface pins of the memory matrix, and wherein the interface pins of the processor hardmac have substantially the same pin order along the hardmac edge as the interface pins along the matrix edge; and
mapping a support memory for the processor hardmac to a portion of the memory matrix along the hardmac edge.

23. The method of claim 22 wherein the base platform comprises a plurality of different valid placement locations along the matrix edge for the processor hardmac and wherein:
placing the processor hardmac comprises placing the processor hardmac in one of the valid placement locations; and
mapping the support memory comprises mapping the support memory so as to have a starting column, which is offset from one end of the memory matrix by an integral number of columns of leaf cells, which corresponds to the respective placement location of the processor hardmac.

24. The method of claim 22 wherein the step of mapping support memory is unconstrained by the base platform to a predefined set of support memory sizes and is unconstrained by predefined configurations of the processor hardmac.

25. The method of claim 22 wherein the processor hardmac has a configuration for implementing an instruction set, which is unconstrained by predefined configurations of the memory matrix, other than by a size of the memory matrix.

26. The method of claim 22 and further comprising:
placing a further processor hardmac along the memory matrix, which comprises a hardmac edge adjacent the memory matrix edge and a plurality of interface pins for interfacing with corresponding interface pins of the memory matrix, wherein the interface pins of the further processor hardmac have substantially the same pin order along the corresponding hardmac edge as the interface pins along the matrix edge; and
mapping a further support memory to an additional portion of the memory matrix along the further hardmac edge.

27. The method of claim 26 wherein the further processor hardmac has an instruction set and a size, at least one which differs from that of the first mentioned processor hardmac.

* * * * *